United States Patent
Chen et al.

(10) Patent No.: US 9,286,995 B2
(45) Date of Patent: Mar. 15, 2016

(54) MEMORY SYSTEM AND CONTROL METHOD

(71) Applicant: KABUSHIKI KAISHA TOSHIBA, Tokyo (JP)

(72) Inventors: Jiezhi Chen, Kanagawa (JP); Yuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/669,687

(22) Filed: Mar. 26, 2015

(65) Prior Publication Data

US 2015/0364206 A1    Dec. 17, 2015

(30) Foreign Application Priority Data

Jun. 16, 2014 (JP) ................. 2014-123639

(51) Int. Cl.
*G11C 16/10* (2006.01)
*G11C 16/34* (2006.01)
*G11C 11/56* (2006.01)

(52) U.S. Cl.
CPC ........ *G11C 16/3427* (2013.01); *G11C 11/5671* (2013.01); *G11C 16/3431* (2013.01); *G11C 16/3459* (2013.01)

(58) Field of Classification Search
CPC ............... G11C 11/56; G11C 11/5621; G11C 11/5628; G11C 11/5671; G11C 16/3427; G11C 16/3431; G11C 16/3459
See application file for complete search history.

(56) References Cited

U.S. PATENT DOCUMENTS

| | | | | |
|---|---|---|---|---|
| 6,396,752 B2 * | 5/2002 | Lupke | ............... | G11C 29/50 365/185.22 |
| 8,294,488 B1 * | 10/2012 | Derhacobian | .......... | H03K 19/02 326/38 |
| 8,315,104 B2 * | 11/2012 | Futatsuyama | ...... | G11C 16/3454 365/185.01 |
| 8,902,651 B2 * | 12/2014 | Kwak | ............. | H01L 27/1157 365/185.03 |
| 9,087,594 B2 * | 7/2015 | Moschiano | ........ | G11C 11/5628 |
| 2005/0018484 A1 | 1/2005 | Sakuma et al. | | |
| 2008/0310224 A1 * | 12/2008 | Roohparvar | ....... | G11C 11/5628 365/185.03 |

FOREIGN PATENT DOCUMENTS

JP    2005-25898    1/2005
JP    5212143    6/2013

* cited by examiner

*Primary Examiner* — Harry W Byrne
*Assistant Examiner* — Lance Reidlinger
(74) *Attorney, Agent, or Firm* — Finnegan, Henderson, Farabow, Garrett & Dunner, L.L.P.

(57) ABSTRACT

A memory system according to embodiments comprises a memory chip that includes a memory cell array having a plurality of memory cells, a first writing unit that writes first data in a first memory cell in the memory cell array, and a second writing unit that writes second data in a second memory cell which is adjacent to the first memory cell. The second data is used in adjusting a threshold value of the first memory cell.

8 Claims, 13 Drawing Sheets

MEMORY SYSTEM AND CONTROL METHOD

CROSS-REFERENCE TO RELATED APPLICATIONS

This application is based upon and claims the benefit of priority from Japanese Patent Application No. 2014-123639, filed on Jun. 16, 2014; the entire contents of which are incorporated herein by reference.

FIELD

Embodiments described herein relate generally to a memory system and a control method.

BACKGROUND

In recent years, with the generational evolution in memory chips, not only the size of memory cells has undergone miniaturization but also the distance between memory cells has become shorter. As a result, however, inter-cell interference has been increasing. In that regard, usually, memory operations are performed according to an operation sequence that is aimed at preventing inter-cell interference. However, in a multivalued nonvolatile memory such as a multivalued NAND flash memory, in order to ensure a high degree of reliability, the operation sequence for data writing has become extremely complex. For that reason, in order to prevent inter-cell interference from occurring, it becomes necessary to adjust the operation sequence for data writing at a minute level. As a result, it may take an extremely long period of time to perform data writing. At the same time, in order to enhance the performance of memory operations, it is extremely important to achieve enhancement in the operation speed.

DETAILED DESCRIPTION

An exemplary embodiment of a control device, a memory system including the control device, and a control method is described below in detail with reference to the accompanying drawings. The memory system, according to the embodiment enables achieving reduction or elimination of defective bits during reading and achieving reduction or elimination defective bits that go on increasing accompanying an increase in the data reserve time or an increase in the writing/deletion cycle count. In this explanation, defective bits represent bits that are read as different values than the stored values.

While writing data in a particular memory cell (hereinafter, simply called a cell), threshold distribution of the neighboring cells is shifted. This is called inter-cell interference effect. In the embodiment, inter-cell interference is used to enhance the degree of reliability so that it becomes possible to achieve reduction or cancellation of defective bits during reading and to achieve reduction or cancellation of defective bits that go on increasing accompanying an increase in the data reserve time or an increase in the writing/deletion cycle count. With reference to the accompanying drawings, explained below in detail is the mechanism of enhancing the degree of reliability with the use of the inter-cell interference effect. In the following explanation, a cell may either represent a single cell or represent a group of cells that includes a plurality of cells connected in the same word line.

Figure 1:
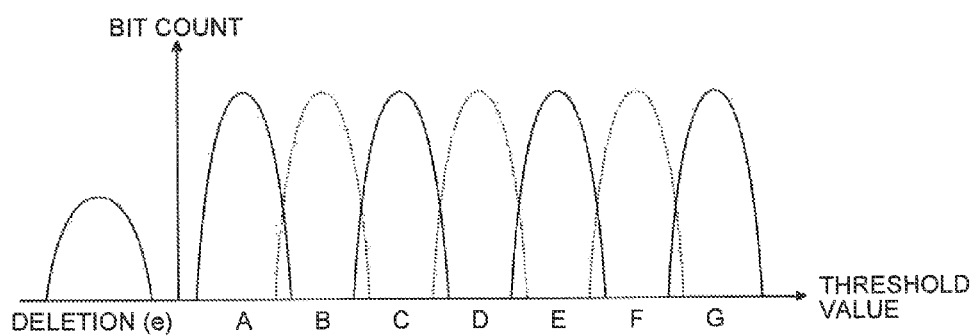
FIG. 1 is a schematic diagram illustrating an example of threshold distributions of cells each of which operates with multivalued bits.

FIG. 1 is a schematic diagram illustrating an example of threshold distributions of cells each of which operates with multivalued bits (for example, three bits). The threshold distributions illustrated in FIG. 1 are assumed to be statistical distributions obtained from several tens of samples to several hundreds of samples or beyond. As illustrated in FIG. 1, the threshold distributions of the cells operating with three bits have eight peaks equal in number to the number of storable values. The threshold distributions having the peaks can be defined as deletion (e), A, B, C, D, E, F, and G levels in order of increasing voltage levels.

As illustrated in FIG. 1, at the foot portion of each threshold distribution, sometimes there occurs overlapping with the neighboring threshold distributions. Such overlapping of distributions results in the reading of false values during a reading operation. That leads to an increase in the defective bits. Moreover, accompanying an increase in the data reserve time or an increase in the writing/deletion cycle count, the spread of each threshold distribution also increases. Thus, there remains a defect of having an increase in the defective bits accompanying an increase in the data reserve time or an increase in the writing/deletion cycle count.

Figure 2:
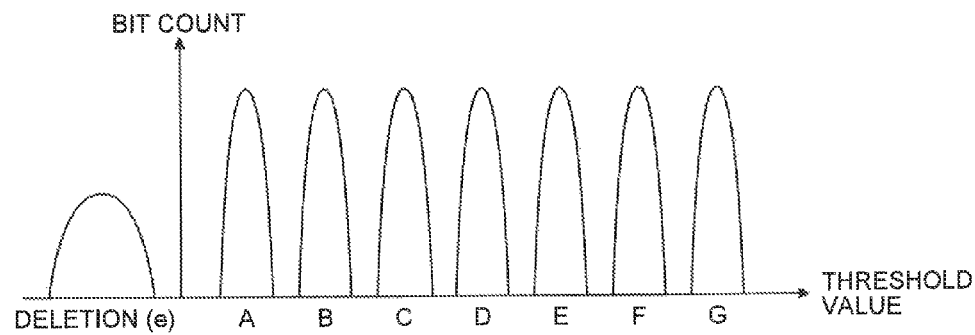
FIG. 2 is a schematic diagram illustrating an example of threshold distributions after threshold adjustment is performed according to the embodiment.

In that regard, in the embodiment, regarding the cells in which data is to be stored, the threshold distributions are adjusted using the inter-cell interference effect. With that, as illustrated in FIG. 2, overlapping among neighboring threshold distributions is eliminated. That enables achieving reduction in the defective bits and achieving a high degree of reliability.

Figure 3:
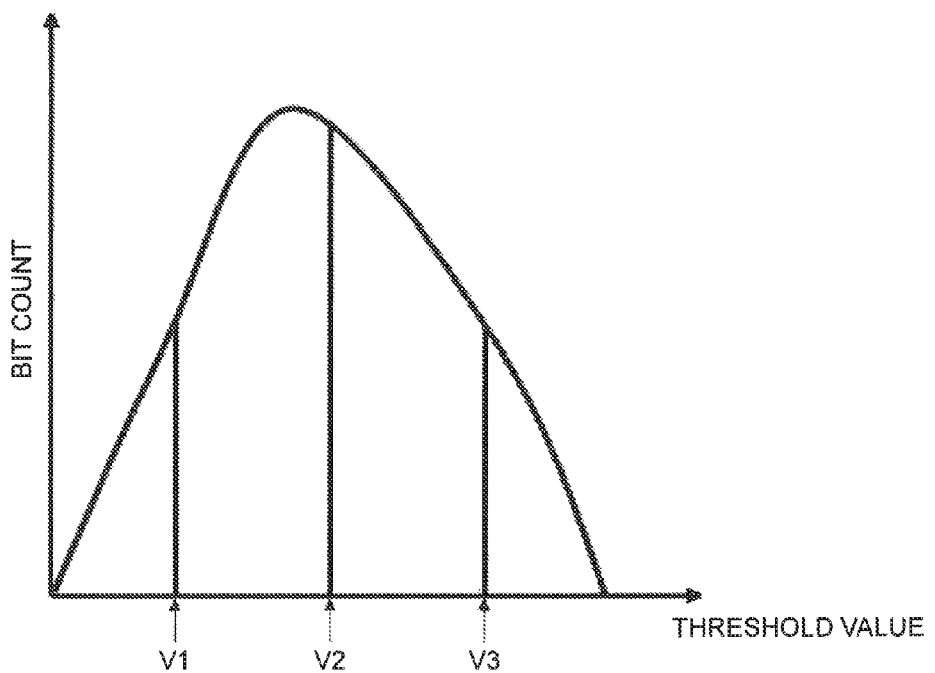
FIG. 3 is a diagram illustrating measured data of a threshold distribution when writing is actually performed in a particular cell.
Figure 4:
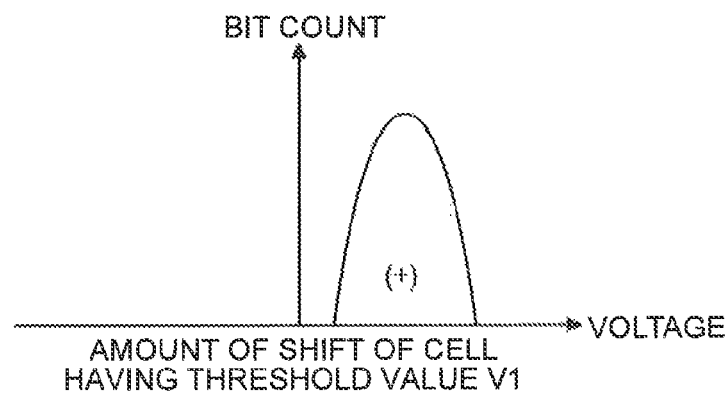
FIG. 4 is a diagram illustrating measured data of a threshold amount shift when the cell having a threshold voltage V1 illustrated in FIG. 3 is subjected to inter-cell interference according to the embodiment.
Figure 5:
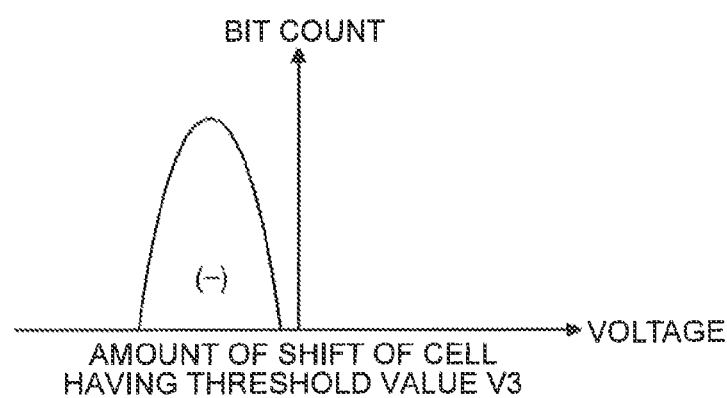
FIG. 5 is a diagram illustrating measured data of a threshold amount shift when the cell having a threshold voltage V3 illustrated in FIG. 3 is subjected to inter-cell interference according to the embodiment.
Figure 6:
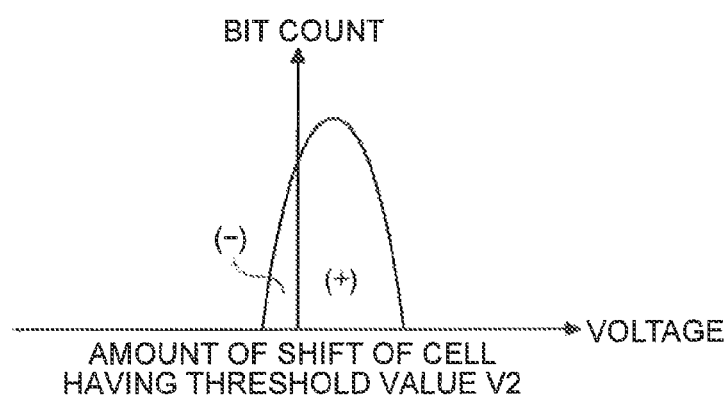
FIG. 6 is a diagram illustrating measured data of a threshold amount shift when the cell having a threshold voltage V2 illustrated in FIG. 3 is subjected to inter-cell interference according to the embodiment.

FIGS. 3 to 6 are diagrams for explaining the amount of shift in threshold voltages (hereinafter, called a threshold shift amount) that is applied to the cells according to the inter-cell interference effect according to the embodiment. FIG. 3 is a diagram illustrating measured data of a threshold distribution when writing is actually performed in a particular cell. FIG. 4 is a diagram illustrating measured data of the threshold amount shift when the cell having a threshold voltage V1 illustrated in FIG. 3 is subjected to inter-cell interference. FIG. 5 is a diagram illustrating measured data of the threshold amount shift when the cell having a threshold voltage V3 illustrated in FIG. 3 is subjected to inter-cell interference. FIG. 6 is a diagram illustrating measured data of the threshold amount shift when the cell having a threshold voltage V2 illustrated in FIG. 3 is subjected to inter-cell interference.

As illustrated in FIGS. 3 and 4, when a cell belonging to a relatively lower voltage range in the threshold distribution (i.e., a cell having the threshold voltage V1) is subjected to inter-cell interference, the threshold voltage of that cell is shifted in the positive direction (+ direction), that is, in the peak direction of the threshold. distribution. On the other hand, as illustrated in FIGS. 3 and 5, when a cell belonging to a relatively higher voltage range in the threshold distribution (i.e., a cell having the threshold voltage V3) is subjected to inter-cell interference, the threshold voltage of that cell is shifted in the negative direction (− direction), that is, in the peak direction of the threshold distribution. Moreover, as illustrated in FIGS. 3 and 6, when a cell that is relatively present in the vicinity of the peak of the threshold distribution (i.e., a cell having the threshold voltage V2) is subjected to inter-cell interference; although that cell gets affected by inter-cell interference, the amount of threshold shift of that cell is smaller than the amount of threshold shift of the cells belonging to other voltage ranges (the relatively higher voltage range and the relatively lower voltage range).

In this way, when the cells belonging to off-peak voltage ranges in the threshold distribution (i.e., belonging to the relatively higher voltage range and the relatively lower voltage range) are subjected to inter-cell interference, then the threshold voltages of those cells act to shift in the peak direction of the threshold distribution. In contrast, when the cells present in the vicinity of the peak in the threshold distribution are subjected to inter-cell interference, the threshold values of those cells act to remain in the vicinity of the peak. In that regard, in the embodiment, regarding a cell belonging to a range in which the threshold voltage overlaps with a neighboring threshold distribution, the threshold voltage of that cell is shifted in the direction of separation according to the inter-cell interference effect. As a result, as illustrated in FIG. 2 the threshold distributions can be separated in such a way that a certain margin is maintained therebetween. That enables achieving reduction in the defective bits during reading. Moreover, due to an identical action, it also becomes possible to curb or avoid the occurrence of a defect of having an increase in the defective bits accompanying an increase in the data reserve time or an increase in the writing/deletion cycle count.

Figure 7:
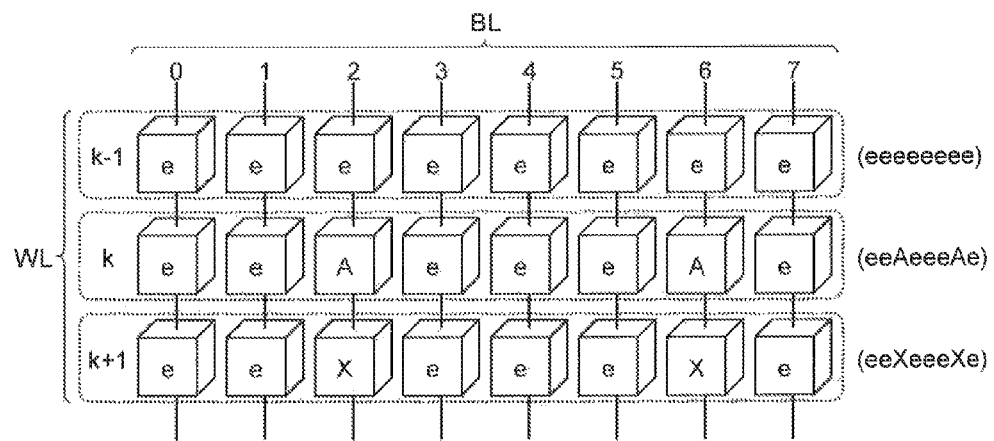
FIG. 7 is a diagram illustrating exemplary arrangement patterns of cells affected by inter-cell interference and cells causing inter-cell interference according to the embodiment.

FIG. 7 is a diagram illustrating exemplary arrangement patterns of cells affected by inter-cell interference (hereinafter, called victim cells) and cells causing inter-cell interference (hereinafter, called attacker cells). In data patterns illustrated in FIG. 7, in a word line WL(k) (where k is an integer equal to or greater than one) in which victim cells are connected (hereinafter, called a victim word line), data "eeAeeeAe" is written. Similarly, in a word line WL (k+1) in which attacker cells are connected (hereinafter, called an attacker word line), data "eeXeeeXe" is written. Herein, "e" represents the value of a deletion (e) level; and "A" represents the value of an A level. Moreover, "X" represents an arbitrary variable that can take a value from the deletion (e) level to a G level.

Among the cells connected in the victim word line WL(k), the cells having "A" written therein represent victim cells. On the other hand, among the cells connected in the attacker word line WL(k+1), the cells having the variable "X" written therein represent attacker cells. As illustrated in FIG. 7, a victim cell and an attacker cell can be neighboring cells across two neighboring word lines (such cell are called first neighboring cells). However, that is not the only possible case. Alternatively, as far as attacker cells are concerned, any cell capable of causing inter-cell interference to a victim cell, such as both or either one of two cells sandwiching a first neighboring cell in an attacker word line, can be used as an attacker cell.

Meanwhile, among the victim cells present in the same word line, the deletion (e) level, is written in at least a single cell in order to prevent inter-cell interference among bit lines. Moreover, in a word line WL(k−1) positioned on the opposite side of the attacker word line WL(k+1) across the victim word line WL(k); for example, a data pattern such as "eeeeeeee" is stored so as to ensure that a victim cell is spared from being affected by intercell interference from a cell in another word line (such as a cell in a word line WL(k−2)).

While writing the data patterns illustrated in FIG. 7; firstly, the entire block including the target word line for writing is deleted from the memory chip. Then, for example, in order to prevent inter-cell interference among bit lines, the stored data (herein, the A level) is written in non-neighboring victim cells in the victim word line WL(k). Then, in the attacker word line WL(k+1) neighboring to the victim word line WL(k) data for threshold voltage adjustment with respect to the victim cells (herein, called threshold adjustment data) is written. As a result, the victim cells are subjected to inter-cell interference and the respective threshold values shift to be within the desired voltage range. Hence, a certain margin is secured between the threshold distributions. Meanwhile, the arrangement of victim cells is not limited to the arrangement illustrated in FIG. 7. Alternatively, various modifications are possible. For example, the cells arranged at odd positions in the victim word line WL(k) can be treated as the victim cells.

Figure 8:
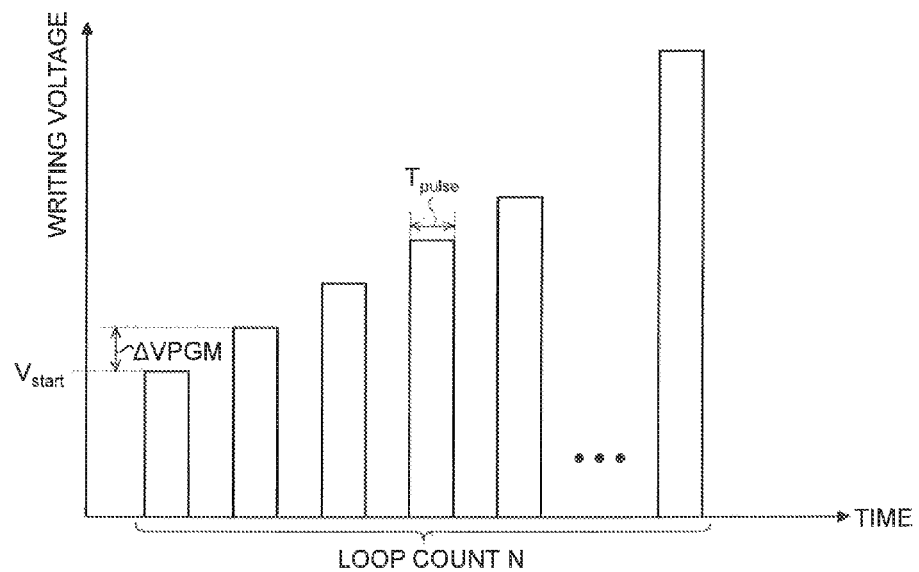
FIG. 8 is a diagram illustrating a relationship between the writing voltage and the loop count in a writing operation sequence according to the embodiment.

Given below with reference to the accompanying drawings is the detailed explanation of an operation sequence according to the embodiment. FIG. 8 is a diagram illustrating a relationship between the writing voltage and the loop count in a writing operation sequence. As illustrated in FIG. 8, in the writing operation sequence, a writing voltage, which has a certain pulse time $T_{pulse}$ and which is obtained as a combination of a certain start voltage $V_{start}$ and a step voltage $\Delta VPGM$ of a constant width, is applied with respect to the target cells for writing for a loop count N. Herein, the start voltage $V_{start}$, the step voltage $\Delta VFGM$, the pulse time $T_{pulse}$, and the loop count N differ according to the generation, of the NAND flash memory. Moreover, these parameters can be adjusted at a minute level in the actual operation mode.

Figure 9:
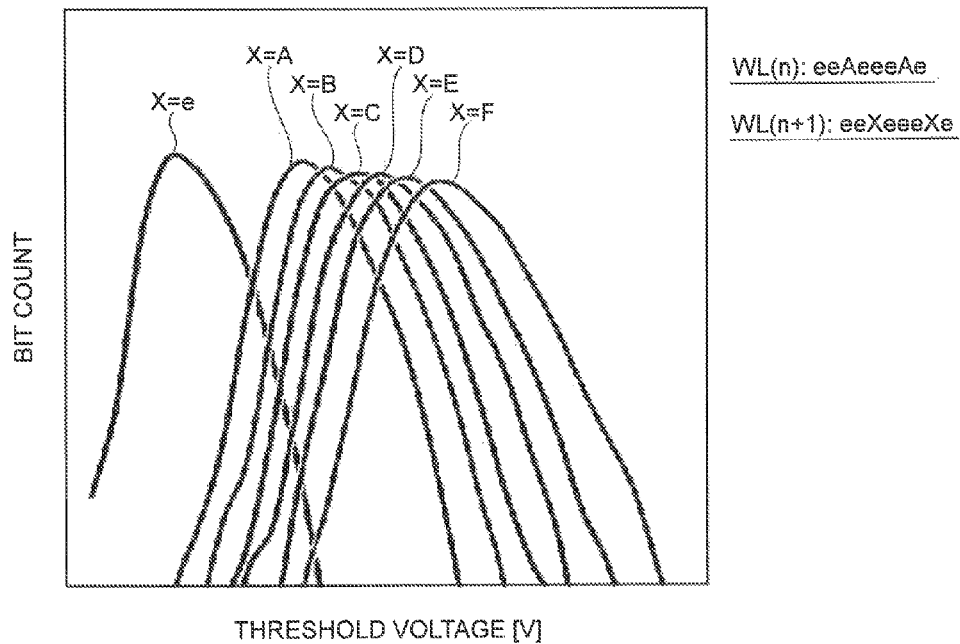
FIG. 9 is a diagram illustrating measured data of threshold distributions of victim cells in the case when, in the data patterns illustrated in FIG. 7, a value "X" of attacker cells is changed from a deletion (e) level to an F level according to the embodiment.
Figure 10:
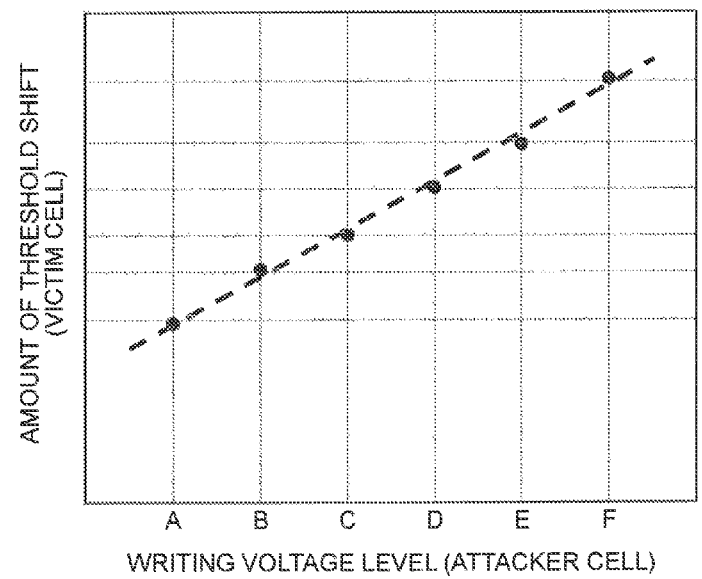
FIG. 10 is a graph illustrating the relationship between the voltage level written in the attacker cells, which are obtained from the measured data illustrated in FIG. 9, and the threshold shift amount of the victim cells according to the embodiment.

Given below with reference to the accompanying drawings is the detailed explanation about the threshold shift amount of victim cells at the time of writing the data patterns illustrated in FIG. 7. FIG. 9 is a diagram illustrating measured data of the threshold distributions of victim cells in the case when, in the data patterns illustrated in FIG. 7, the value "X" of attacker cells is changed from the deletion (e) level to the F level. FIG. 10 is a graph illustrating the relationship between the voltage level written in the attacker cells, which are obtained from the measured data illustrated in FIG. 9, and the threshold shift amount of the victim cells.

As illustrated in FIGS. 9 and 10, the threshold shift amount of the victim cells changes depending on the voltage level written in the attacker cells (i.e., depending on the variable "X"). It implies that, if the voltage level written in the attacker cells is adjusted, then the threshold distributions of the victim cells can be controlled. That is, if the variable "X" in the data pattern (eeXeeeXe) written in the attacker word line WL(k+1) is adjusted, then the threshold shift amount of the victim word line WL(k) can be controlled at a minute level.

Meanwhile, the value of the variable "X" written in the attacker cells can be obtained in advance according to, for example, the values written in the victim cells. Alternatively, the value of the variable "X" can also be identified by verifying the victim cells while writing values in the attacker cells.

Figure 11:
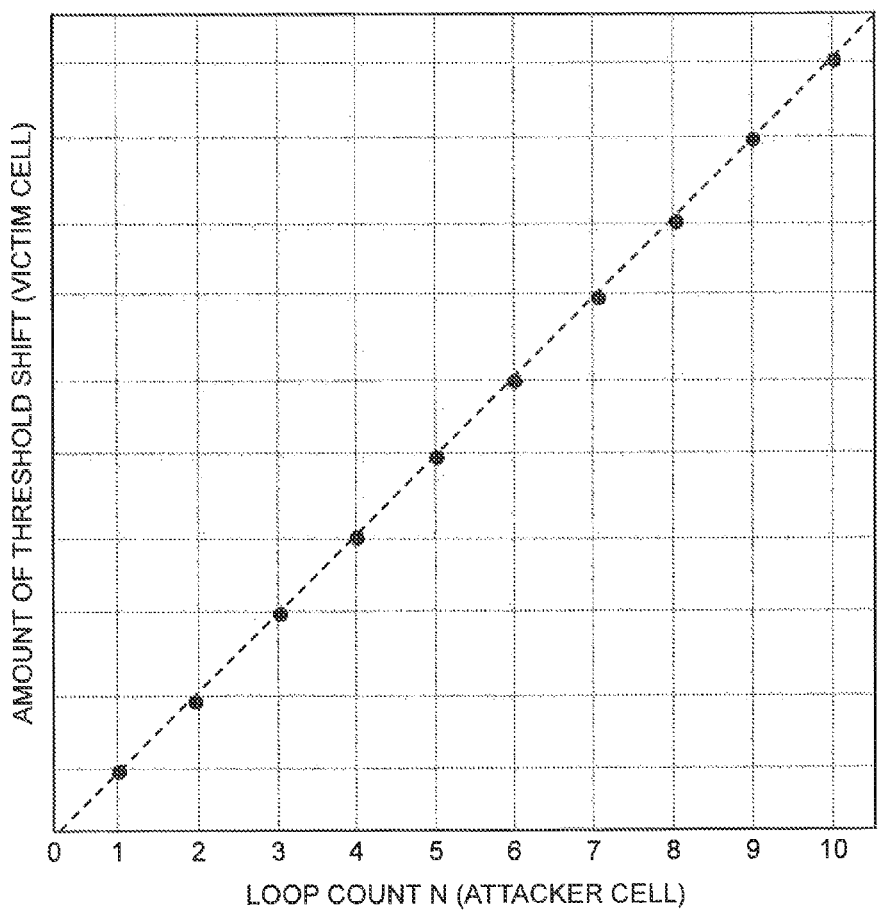
FIG. 11 is a graph illustrating the relationship between the loop count in the writing operation sequence with respect to the attacker cells and the threshold shift amount of the victim cells according to the embodiment.

The threshold shift amount of the victim cells can be controlled also by adjusting the loop count N in the writing operation sequence with respect to the attacker cells. FIG. 11 is a graph illustrating the relationship between the loop count in the writing operation sequence with respect to the attacker cells and the threshold shift amount of the victim cells. As illustrated in FIG. 11, along with an increase in the loop count N of the writing operation performed with respect to the attacker cells, there is an increase in the threshold shift amount of the victim cells. It implies that if the number of times for which writing is performed with respect to the attacker cells (i.e., if the loop count N) is adjusted, the threshold distributions of the victim cells can be controlled. Alternatively, instead of adjusting the loop count N, if the step voltage $V_{start}$ or the step voltage $\Delta VPGM$ in the writing operation sequence with respect to the attacker cells is adjusted; it is still possible to control the threshold shift amount of the victim cells.

From the explanation given till now, it is clear that the threshold shift voltage can be controlled by adjusting the writing operation sequence with respect to the attacker cells and adjusting at least one of the writing voltage level (the variable "X"), the number of times for which writing is performed (the loop count N), the step voltage $V_{start}$, and the step voltage $\Delta VPGM$. Regarding which of the writing voltage level (the variable "X"), the number of times for which writing is performed (the loop count N), the step voltage $V_{start}$, and the step voltage $\Delta VPGM$ is to be adjusted; it is possible to make appropriate selection depending on the device characteristics and the operation sequence.

Figure 12:
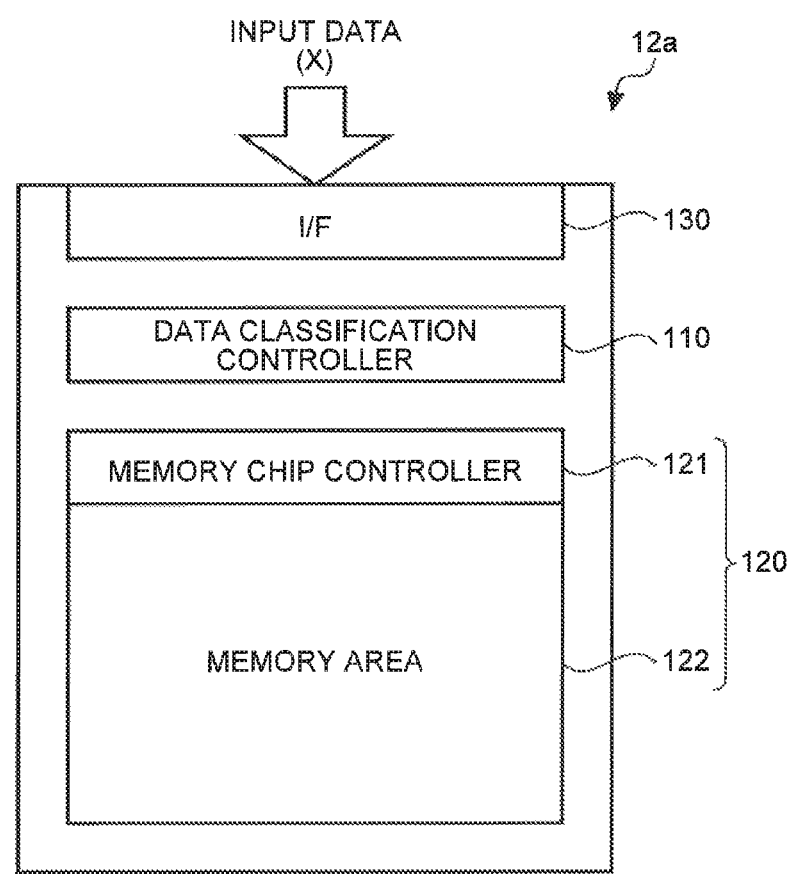
FIG. 12 is a block diagram illustrating an exemplary overall configuration of a memory system according to the embodiment.

Given below with reference to the accompanying drawings is the detailed explanation of a nonvolatile memory system (hereinafter, simply called a memory system) according to the embodiment. FIG. 12 is a block diagram illustrating an exemplary overall configuration of the memory system according to the embodiment. As illustrated in FIG. 12, a memory system 100 includes a data classification controller (DCC) 110, a memory chip 120, and an I/F 130 that is an interface for data input and data output. The memory chip 120 includes a memory area 122, which serves as a data storage area in which a plurality of cells are two-dimensionally arranged, and a memory chip controller 121, which controls the access with respect to the memory area 122. Meanwhile, in the memory area 122, a word line for data storage, in which destination cells for data storage are connected, corresponds to a victim word line; and a word line for threshold adjustment, which is neighboring to the word line for data storage and which includes connected cells having threshold adjustment data written therein for adjusting the threshold distributions of the word line for data storage, corresponds to an attacker word line.

Given below is the explanation of the operations performed by the DCC 110 according to the embodiment. The DCC 110 performs the following operations: classifying the data that is input via the I/F 130; recording the memory chip usage environment; selecting various operation sequences; generating threshold adjustment data to be written in the word line for threshold adjustment (i.e., the attacker word line); and arranging data addresses. Moreover, the DCC 110 transfers input data (X) for storage, which is input via the I/F 130, to the memory chip controller 121 of the memory chip 120.

Figure 13:
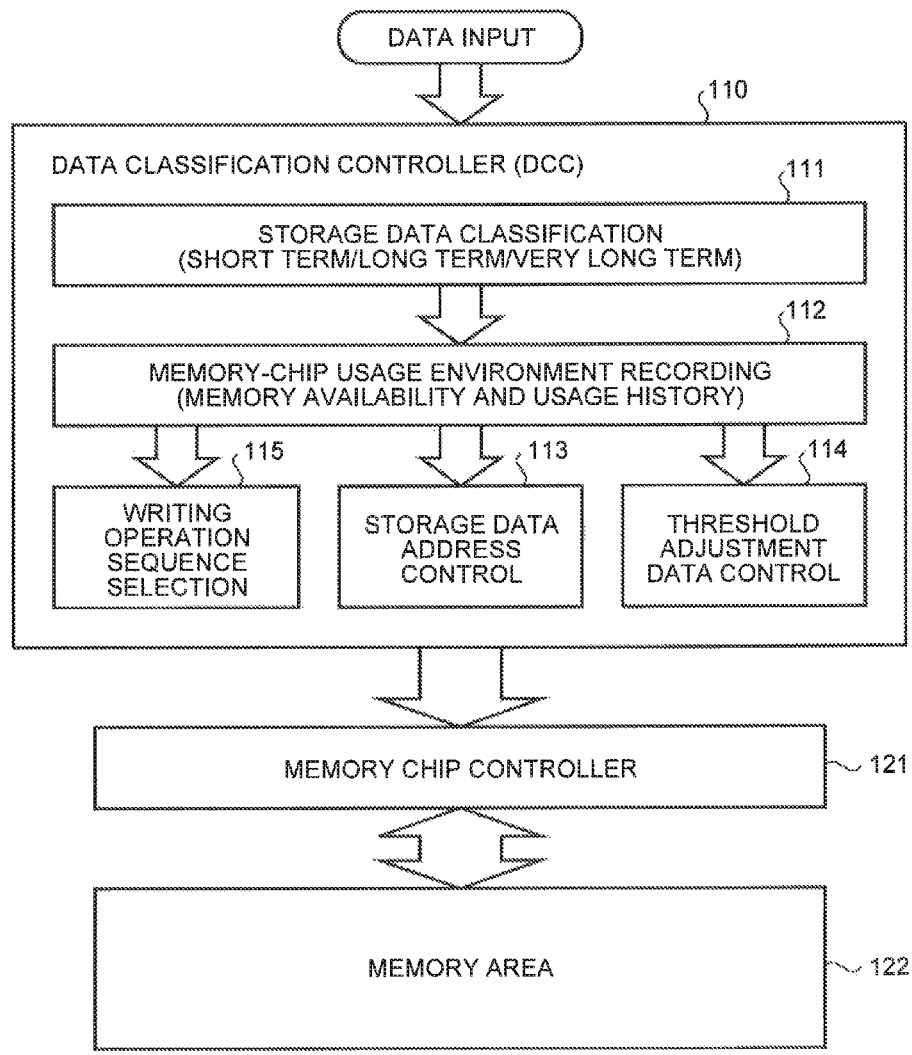
FIG. 13 is a functional block diagram for explaining in detail the operations performed by a data classification controller according to the embodiment.

FIG. 13 is a functional block diagram for explaining in detail the operations performed by the DCC 110. As illustrated in FIG. 13, the DCC 110 performs storage data classification 111, memory-chip usage environment recording 112, storage data address control 113, threshold adjustment data control 114, and writing operation sequence selection 115.

During the storage data classification 111, the data that is input via the I/F 130 (hereinafter, called storage data (or first data)) is classified depending on whether the data is intended to be stored for a short period of time, or whether the data is intended to be stored for a long period of time, or whether the data is intended to be stored for a very long period of time. During the memory-chip usage environment recording 112, the memory availability (free space) of the memory area 122 and the usage history indicating the number of times for which writing/deletion is performed is recorded and managed.

During the storage data address control 113, based on the classification of storage data performed during the storage data classification 111 and based on the usage history of the memory chip 120 as recorded/managed during the memory-chip usage environment recording 112, data addresses specifying the storage destination of storage data are arranged in the word line for data storage. During the threshold adjustment data control 114, the threshold adjustment data for threshold adjustment (also called second data) (the variable "X") is generated. During the writing operation sequence selection 115, based on the classification of the storage data and the usage history of the memory chip 120, the writing operation sequence is selected for the storage data and the threshold adjustment data. At that time, as described above, at least one of the following can be adjusted: the number of times for which writing is performed (the loop count N); the step voltage $V_{start}$; and the step voltage $\Delta VPGM$.

The data addresses and the storage data arranged during the storage data address control 113, the threshold adjustment data generated during the threshold adjustment data control 114, and the writing operation sequence selected during the writing operation sequence selection 115 are input to the memory chip controller 121. Then, the memory chip controller 121 performs operations based on the data addresses, the storage data, the threshold adjustment data, and the writing operation sequence input thereto; records the storage data in a predetermined address space; and adjusts the threshold values of the victim cells in which the storage data is recorded.

Figure 14:
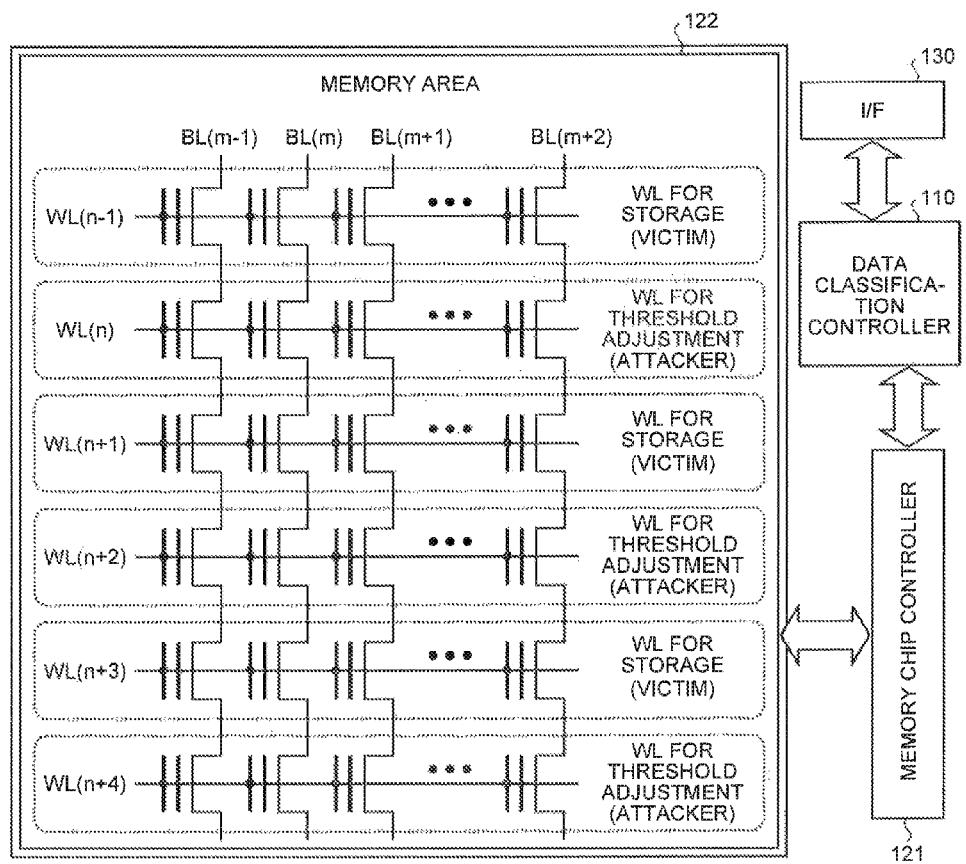
FIG. 14 is a schematic diagram illustrating an exemplary arrangement of victim word lines and attacker word lines in a memory area according to the embodiment.

FIG. 14 is a schematic diagram illustrating an exemplary arrangement of victim word lines (word lines for storage) and attacker word lines (word lines for threshold adjustment) in the memory area 122. Herein, a victim word line represents a word line for storage in which the storage data is stored; and an attacker word line represents a word line for threshold adjustment in which threshold adjustment data is stored. In FIG. 14 is illustrated an exemplary arrangement in the case in which the data is intended to be stored for a very long period of time (depending on the situation, also including the case of data storage for a long period of time). In the case in which the data is intended to be stored for a short period of time, the word line for threshold adjustment can be omitted in an identical manner to the normal arrangement.

As illustrated in FIG. 14, in the memory area 122, for example, the word lines WL for storage (that are interference victims) are arranged at odd-numbered lines and the word lines for threshold adjustment (that are interference attackers) are arranged at even-numbered lines. Regarding the word line WL for storage arranged at a particular odd-numbered line, threshold training data corresponding to the concerned storage data is stored in the word line WL for threshold adjustment arranged in the next even-numbered line.

Regarding such an arrangement, as far as the writing sequence of data is concerned; firstly, the storage data is written in the earliest odd-numbered word line WL(n−1) for storage in the target area for writing, and then the threshold adjustment data is written in the next even-numbered word line WL(n) for threshold adjustment. Subsequently, the next set of storage data is written in the next earliest odd-numbered word line WL(n+1), and then the threshold adjustment data is written in the next even-numbered word line WL(n+2) for threshold adjustment. Thereafter, the storage data and the threshold adjustment data are alternately written in an identical writing sequence.

Meanwhile, in between each pair of a word line WL for storage and a word line WL for threshold adjustment (for example, in between the word line WL(n) for threshold adjustment and the word line WL(n+1) for storage, it is possible to arrange a word line in which a data pattern for interference prevention, such as "eeeeeeee", is stored. In that case, the writing sequence regarding the word lines WL becomes modifiable in various ways.

Figure 15:
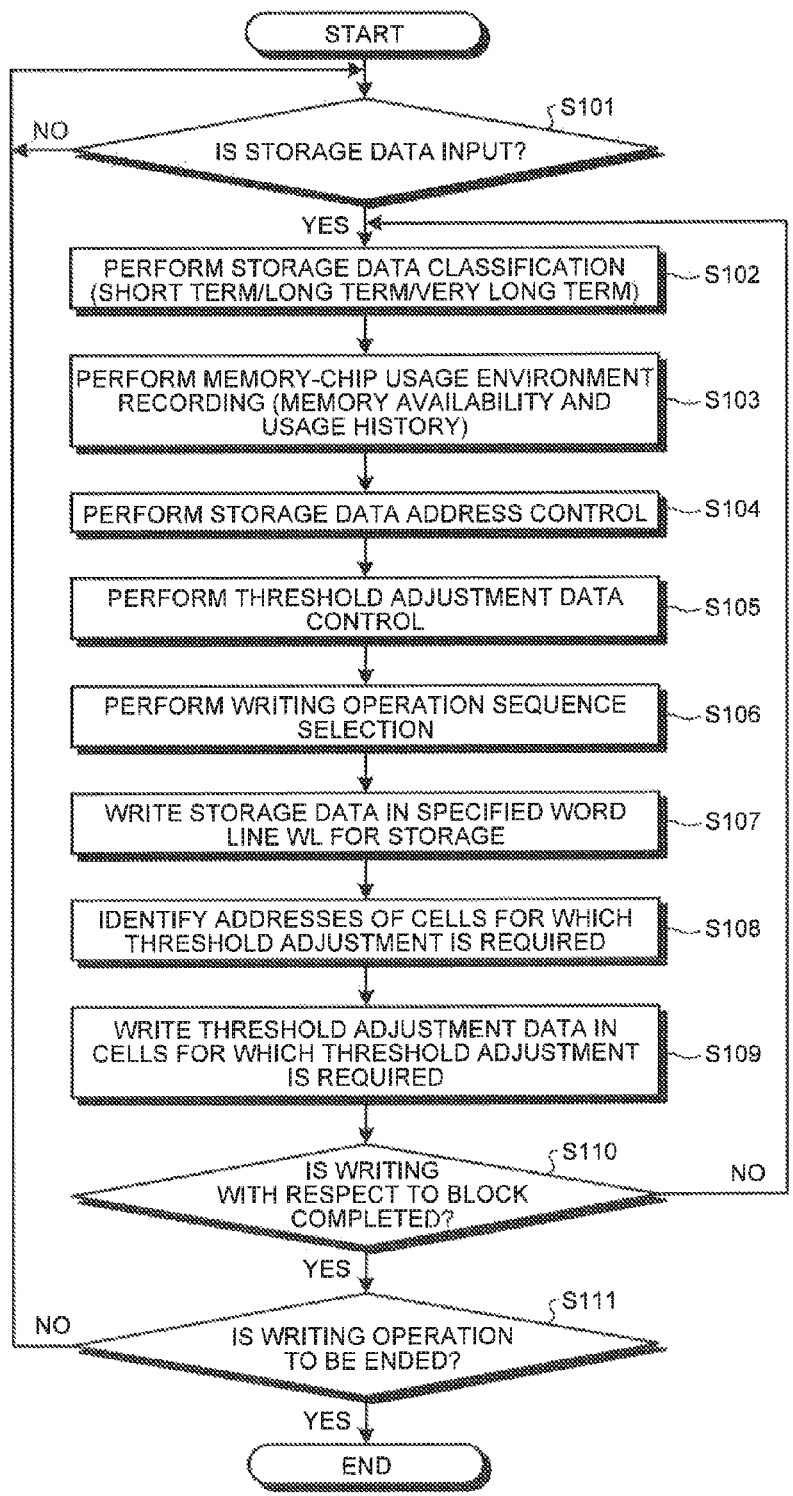
FIG. 15 is a flowchart for explaining an example of operations during the writing performed by the data classification controller according to the embodiment.

Given below with reference to the accompanying drawings is the detailed explanation of the operations during the writing performed by the DCC 110 according to the embodiment. FIG. 15 is a flowchart for explaining an example of operations during the writing performed by the DCC 110 according to the embodiment. Herein, the writing operation illustrated in FIG. 15 is assumed to be performed. In units of blocks of the memory area 122.

As illustrated in FIG. 15, firstly, the DCC 110 waits until storage data is input via the I/F 130 (NO at Step S101). When storage data is input (YES at Step S101), the DCC 110 performs the storage data classification 111 and identifies whether the storage data that is input is intended to be stored for a short period of time or whether the data is intended to be stored for a long period of time or for a very long period of time (Step S102). Then, the DCC 110 performs the memory-chip usage environment recording 112 and confirms the memory availability and the usage history of the memory area 122 (Step S103). Meanwhile, during the memory-chip usage environment recording 112, a specific memory area secured for the purpose of recording the memory availability and the usage history is referred, and recording is also done in that specific memory area This specific memory area can be a part of the memory area 122 in the memory chip 120.

Subsequently, the DCC 110 performs the storage data address control 113; and converts the storage data into data patterns for writing and into the writing levels (e and A to G) for the cells, and converts the logical addresses of the post-conversion storage data into physical addresses in the memory area 122 (Step S104). Moreover, the DCC 110 performs the threshold adjustment data control 114 and determines the threshold adjustment data (the variable "X") (Step S105). Furthermore, the DCC 110 performs the writing operation sequence selection 115 and selects the writing operation sequence for the post-conversion storage data (Step S106). Meanwhile, at Steps S105 and S106, instead of determining the threshold adjustment data or in addition to determining the threshold addition data, at least one of the following parameters can also be adjusted: the number of times for which writing is performed (the loop count N); the step voltage $V_{start}$; and the step voltage $\Delta$VPGM.

Then, the DCC 110 writes the post-conversion storage data in the word line WL for storage that is present at the addresses specified during the storage data address control 113 (at Step S104) (Step S107). Meanwhile, writing of the storage data in the memory area 122 is performed when the DCC 110 inputs necessary data and necessary parameters to the memory chip controller 121.

Subsequently, the DCC 110 reads the value from each cell of the word line WL for storage in which the storage data is written; identifies the addresses of the cells for which threshold adjustment is required (Step S108); and writes the threshold adjustment data (the variable "X") in the identified addresses (Step S109).

Then, the DCC 110 identifies whether or not the writing with respect to the block has completed (Step S110). If the writing is not yet completed (NO at Step S110), the system control returns to Step S102 and the subsequent operations are performed. When the writing is completed (YES at Step S110), the DCC 110 determines whether or not to end the writing operation (Step S111). If the writing operation is not to be ended (NO at Step S111), the system control returns to Step S101 and the subsequent operations are performed. When the writing operation is to be ended (YES at Step S111), it marks the end of the operations.

Meanwhile, while writing the threshold adjustment data at Step S109; during the writing of the threshold adjustment data in the attacker cells, the threshold values of the victim cells can be monitored. This monitoring operation can be an identical operation to the verification operation performed during the normal writing operation sequence. That is, while writing the threshold adjustment data, the writing cycle with respect to the attacker cells and the verification of the victim cells can he performed in an alternate manner. In that case, at the point of time when it is verified that the threshold values of the victim cells have shifted by a sufficient amount, the writing cycle with respect to the attacker cells can be ended. In this way, the writing level of the attacker cells in which the threshold adjustment data is written does not necessarily correspond to the variable "X". However, the target threshold voltage at the time of writing the threshold adjustment data can he same as the writing target for each level (for example, a target threshold voltage Vth for the level A, or target threshold voltages Vth and B for the levels A and B, respectively).

Taking a specific example, according to the writing operation sequence that has been selected, the storage data is stored in the word line WL(n−1) for storage within a short period of time (for example, within 3 milliseconds or less). Then, the victim cells in which the storage data is written are verified for the purpose of identifying the addresses of the victim cells for which threshold adjustment is required. Subsequently, based on the verified addresses, the threshold adjustment data is written in the attacker cells neighboring to the victim cells in need of threshold adjustment. Then, the victim cells for which threshold adjustment is required (or the entire word line for storage) is verified again, and it is determined whether or not further threshold adjustment is required, if further threshold adjustment is required, the threshold adjustment data is again written in the attacker cells neighboring to the victim cells in need of threshold adjustment. Then onward, the same operations are repeated so as to perform adjustment in such a way that overlapping is eliminated among the threshold distributions in which the victim cells are neighboring to each other.

Meanwhile, in order to further shorten the writing operation sequence, the writing cycle implemented in a repeated manner while writing the storage data can be implemented, for a smaller loop count than the current loop count. As a result, a writing operation sequence can be implemented in which not only a high degree of reliability is achieved with the aim of long term storage of data but also an increase in the writing operation is achieved. However, herein, it is necessary that a voltage width ($V_{over}$) is equal to or smaller than the voltage width for which a shift can occur due to inter-cell interference (equal to or smaller than a threshold shift amount $V_{shift}$). Accordingly, it is desirable that the writing cycle implemented while writing, the storage data is set to have the loop count equal to or greater than the loop count at which the voltage width $V_{over}$ is equal to or smaller than the voltage width $V_{shift}$.

Figure 16:
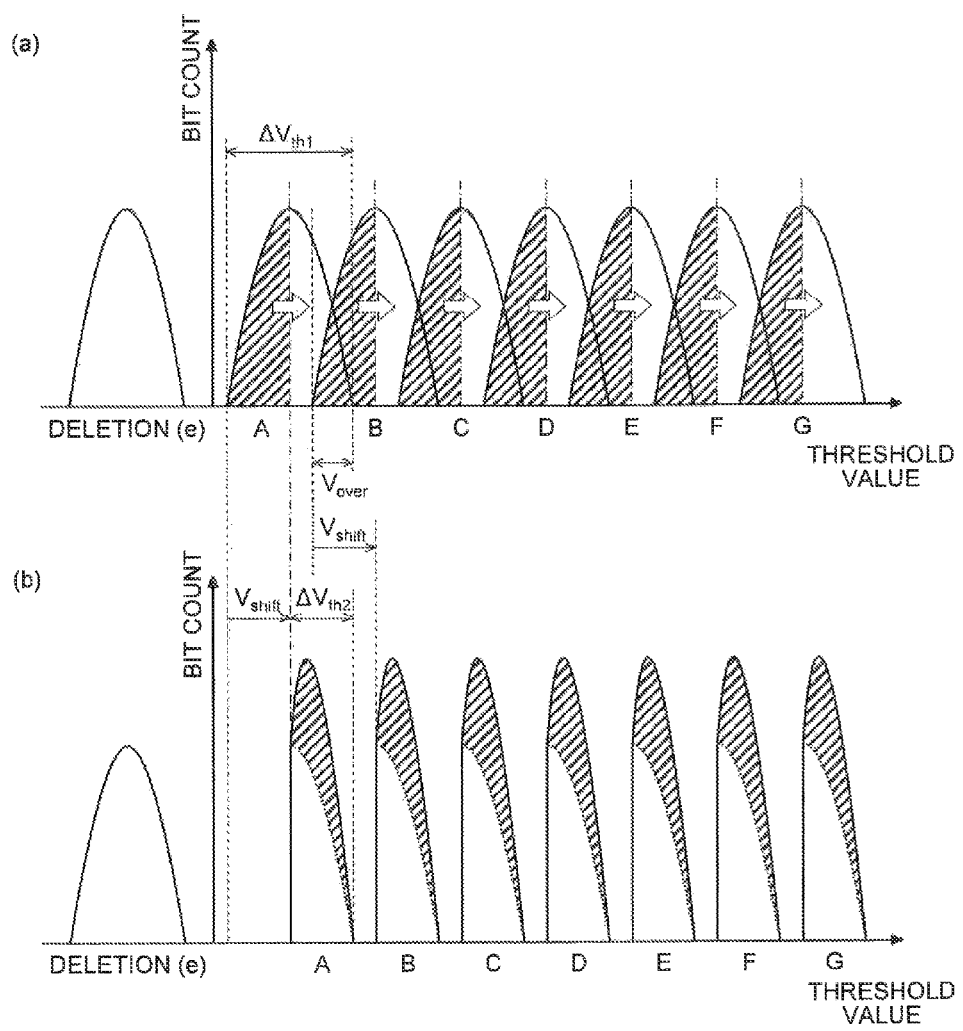
FIG. 16 is a diagram for explaining an example of threshold distribution adjustment according to the embodiment.

As a result of performing operations in the manner described above, the threshold distributions of the victim cells are adjusted in such a way that overlapping among threshold distributions is eliminated. FIG. 16 is a diagram for explaining an example of threshold distribution adjustment according to the embodiment. As illustrated in FIG. 16, in each threshold distribution, victim cells having the threshold values equal to or smaller than a predetermined value are subjected to inte-cell interference. With that, the spread of each threshold distribution can be shortened, and overlapping among the neighboring threshold distributions can be eliminated. In the example illustrated in FIG. 16, the relationship between the overlapping voltage width $V_{over}$ among threshold distributions, a distribution width $\Delta V_{th1}$ of each threshold distribution, the threshold shift amount $V_{shift}$, and a distribution width $\Delta V_{th2}$ of the target threshold distribution can be expressed using Equation (1) or Equation (2) given below.

$$\Delta V_{th2} = \Delta V_{th1} - \Delta V_{shift} \text{ (condition: } \Delta V_{shift} \leq \Delta V_{th1}/2) \quad (1)$$

$$\Delta V_{th2} = \Delta V_{shift} \text{ (condition: } \Delta V_{shift} \geq \Delta V_{th1}/2) \quad (2)$$

Figure 17:
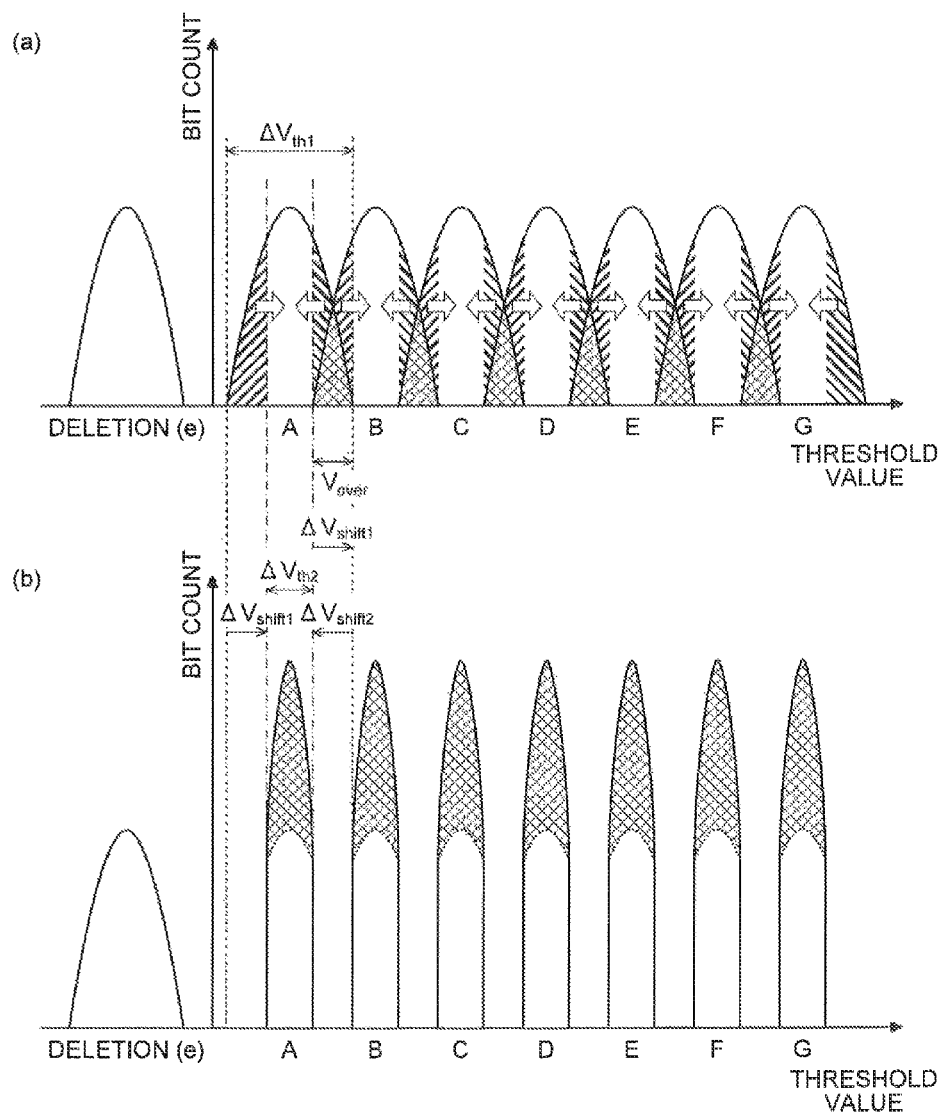
FIG. 17 is a diagram for explaining another example of threshold distribution adjustment according to the embodiment.

FIG. 17 is a diagram for explaining another example of threshold distribution adjustment according to the embodiment. In the example illustrated in FIG. 17, in the spread of each threshold distribution, the threshold values at the foot portion at both ends that overlap with the neighboring threshold distributions are adjusted. In that case, as explained earlier with reference to FIGS. 3 to 6, when the cells belonging to a relatively lower voltage range in each threshold distribution are subjected to inter-cell interference, the threshold voltage of those cells shift in the positive direction (+ direction). On the other hand, when the cells belonging to a relatively higher voltage range in each threshold distribution are subjected to inter-cell interference, the threshold voltage of those cells shift in the negative direction (− direction). Therefore, the threshold values of the foot portions can be accumulated near the center, and the spread of each threshold distribution can be shortened. In the example illustrated in FIG. 7, the distribution width $\Delta V_{th1}$ of a pre-interference threshold distribution and threshold shift amounts and $V_{shift1}$ and $V_{shift2}$ need to be adjusted according to the distribution width $\Delta V_{th2}$ of the target threshold distribution. For example, when the threshold shift amounts $V_{shift1}$ and $V_{shift\ 2}$ are both smaller than half of the distribution width $\Delta V_{th1}$, then Equation (3) given below is established.

$$\Delta V_{th2} = \Delta V_{th1} - \Delta V_{shift1} - \Delta V_{shift2} \quad (3)$$

Moreover, with reference to the examples illustrated in FIGS. 16 and 17, at Step S108 illustrated in FIG. 15, a value is set in advance as a reference value, and the addresses of the victim cells having the threshold values either below the reference value or exceeding the reference value are identified as the target addresses for threshold adjustment. However, that is riot the only possible method. Alternatively, for example, the configuration can be such that, at Step S108 illustrated in FIG. 15, the threshold distribution of the victim cells in each word line for storage (or in the entire block) is obtained, and the address of the victim cells belonging to an overlapping range in that threshold distribution are identified as the target addresses for threshold adjustment.

Figure 18:
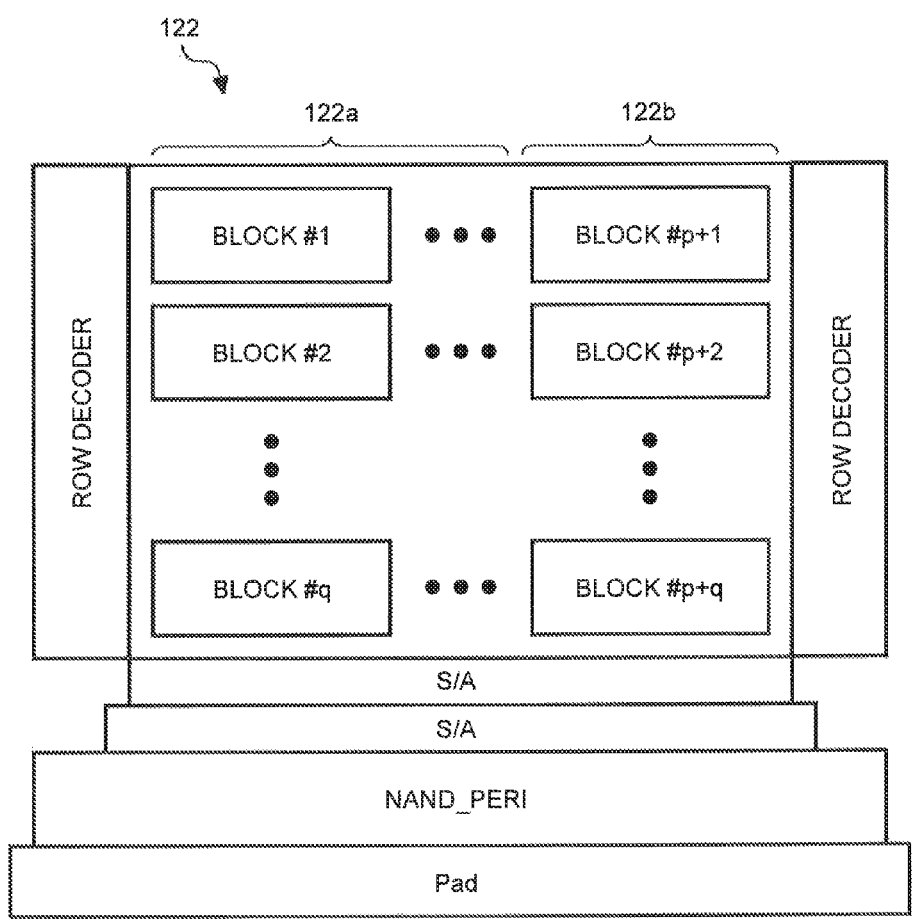
FIG. 18 is a schematic diagram illustrating an exemplary overall configuration in the case in which the memory area is segmented according to the embodiment.

Furthermore, as described earlier too, the DCC 110 is configured to classify the storage data according to the storage time period (a short period of time/a long period of time/a very long period of time), and to store data at different degrees of reliability depending on the classification. In that regard, in the embodiment, it is also possible to set in advance different storage areas in the memory area 122 depending on the storage time period or the required degree of reliability. FIG. 18 is a schematic diagram illustrating an exemplary overall configuration in the case in which the memory area is segmented into an area for long term/very long term storage (or an area for a high degree of reliability); and an area for short term storage (or an area for a low degree of reliability).

With reference to FIG. 18, the area from a block #1 to a block #p is set as a normal memory area 122*a*; while an area from a block #p+1 to a block #p+q is set as a memory area 122*b* for long term/very long term storage (or as a memory area for a high degree of reliability). Herein, it is preferable that the separation of the memory area 122*a* and the memory area 122*b* can be freely changed during the actual use. For example, the entire memory area 122 can be set to be usable as the normal memory area 122*a*, or the entire memory area 122 can be set to be usable as the memory area 122*b* for long term/very long term storage (or as a memory area for a high degree of reliability). Moreover, the configuration can be such that the areas are separated not in units of blocks but in units of word lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a memory chip that includes a memory cell array having a plurality of memory cells;
   a first writing unit that writes first data in a first memory cell in the memory cell array; and
   a second writing unit that writes second data, which is used in adjusting a threshold value of the first memory cell, in a second memory cell which is adjacent to the first memory cell.

2. The memory system according to claim 1, further comprising:
   a classifying unit that classifies the first data; and
   a generating unit that generates the second data according to classification of the first data performed by the classifying unit.

3. The memory system according to claim 1, further comprising a verifying unit that verifies the threshold value of the first memory cell in which the first data is written, wherein
   based on a verification result of the verifying unit, the second writing unit writes the second data in the second memory cell.

4. The memory system according to claim 1, further comprising:
   a verifying unit that verifies the threshold value of the first memory cell in which the first data is written; and
   an identifying unit that, based on a verification result of the verifying unit, identifies a first memory cell for which threshold adjustment is required.

5. The memory system according to claim 4, wherein, based on a verification result of the verifying unit, the identifying unit identifies, as a first memory cell for which the threshold adjustment is required, a first memory cell having a threshold value smaller or greater than a first threshold value.

6. The memory system according to claim 4, wherein, based on a verification result of the verifying unit, the identifying unit identifies, as first memory cells for which the threshold adjustment is required, a first memory cell having a threshold value smaller than a first value and a first memory cell having a threshold value greater than a second value which is greater than the first value.

7. The memory system according to claim 1, wherein the second memory cells are connected in a word line that is neighboring to a word line in which the first memory cells are connected.

8. A control method for a memory system that includes a memory chip including a memory cell array having a plurality of memory cells, the control method comprising:
   writing first data in a first memory cell in the memory cell array; and
   writing second data, which is used in adjusting a threshold value of the first memory cell, in a second memory cell which is adjacent to the first memory cell.

* * * * *